United States Patent
Khwa et al.

(10) Patent No.: US 9,620,210 B2
(45) Date of Patent: Apr. 11, 2017

(54) METHOD AND APPARATUS FOR HEALING PHASE CHANGE MEMORY DEVICES

(71) Applicant: MACRONIX INTERNATIONAL CO., LTD., Hsinchu (TW)

(72) Inventors: Win-San Khwa, Taipei (TW); Chao-I Wu, Hsinchu (TW); Tzu-Hsiang Su, Hsinchu (TW); Hsiang-Pang Li, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/094,993

(22) Filed: Apr. 8, 2016

(65) Prior Publication Data

US 2016/0225448 A1 Aug. 4, 2016

Related U.S. Application Data

(63) Continuation of application No. 14/566,453, filed on Dec. 10, 2014, now Pat. No. 9,336,878.

(Continued)

(51) Int. Cl.
*G11C 13/00* (2006.01)
*G11C 11/56* (2006.01)
*G11C 29/50* (2006.01)

(52) U.S. Cl.
CPC ...... *G11C 13/0097* (2013.01); *G11C 11/5678* (2013.01); *G11C 13/0004* (2013.01);

(Continued)

(58) Field of Classification Search
CPC ............ G11C 13/0097; G11C 13/0069; G11C 13/0004; G11C 11/5614; G11C 13/0021
See application file for complete search history.

(56) References Cited

U.S. PATENT DOCUMENTS

| 7,742,338 | B2 | 6/2010 | Santin et al. |
| 8,488,387 | B2 | 7/2013 | Lue et al. |
| 8,824,212 | B2 | 9/2014 | Lue |
| 8,891,293 | B2 | 11/2014 | Du et al. |
| 9,336,878 | B2 | 5/2016 | Khwa et al. |
| 2009/0109737 | A1* | 4/2009 | Kostylev ............ G11C 13/0004 365/163 |

(Continued)

FOREIGN PATENT DOCUMENTS

WO 2004025659 A1 3/2004

OTHER PUBLICATIONS

Ahn, S. J. et al., "A Highly Manufacturable High Density Phase Change Memory of 64 Mb and Beyond," IEEE IEDM Dec. 13-15, 2004, pp. 907-910.

(Continued)

*Primary Examiner* — Harry W Byrne
*Assistant Examiner* — Ajay Ojha
(74) *Attorney, Agent, or Firm* — Haynes Beffel & Wolfeld LLP

(57) ABSTRACT

A first memory cell including a phase change material. The first memory cell is programmable to store one data value of a plurality of data values. The plurality of data values are represented by a plurality of non-overlapping ranges of resistance of the first memory cell. At least one testing pulse is applied to the first memory cell to establish a cell resistance of the first memory cell in an intermediate range of resistance, the intermediate range of resistance in between first and second adjacent ranges in the plurality of non-overlapping ranges of resistance representing the plurality of data values. After applying the at least one testing pulse to the first memory cell, it is determined whether to apply at least one healing pulse to repair the first memory cell, depending on relative values of (i) the cell resistance in the intermediate range of resistance and (ii) a reference resistance in the intermediate range of resistance.

19 Claims, 8 Drawing Sheets

Related U.S. Application Data

(60) Provisional application No. 62/013,558, filed on Jun. 18, 2014.

(52) U.S. Cl.
CPC .... *G11C 13/0069* (2013.01); *G11C 29/50008* (2013.01); *G11C 11/5614* (2013.01); *G11C 13/0021* (2013.01); *G11C 2213/79* (2013.01); *G11C 2213/82* (2013.01)

(56) References Cited

U.S. PATENT DOCUMENTS

| | | | | |
|---|---|---|---|---|
| 2011/0051507 A1* | 3/2011 | Sarkar | G11C 13/0004 | 365/163 |
| 2011/0080781 A1* | 4/2011 | Goux | G11C 13/0004 | 365/163 |
| 2011/0235403 A1* | 9/2011 | Kang | G11C 13/0004 | 365/148 |
| 2012/0327708 A1* | 12/2012 | Du | G11C 13/0021 | 365/163 |
| 2014/0226388 A1* | 8/2014 | Khoueir | G11C 13/0004 | 365/148 |

OTHER PUBLICATIONS

Chen C-H et al., "Age-Based PCM Wear Leveling with Nearly Zero Search Cost," 49th ACM/EDAC/IEEE Design Automation Conference (DAC), San Francisco, Jun. 2012, pp. 453-458.

Chen, AN et al., "Non-Volatile Resistive Switching for Advanced Memory Applications," IEEE IEDM, Dec. 5-7, 2005, 4 pp.

Gleixner, "Phase Change Memory Reliability", 22nd NVSMW, Aug. 26, 2007, 46 pages.

Khwa, W. S., et al.; A Novel Inspection and Annealing Procedure to Rejuvenate Phase Change Memory from Cycling-Induced Degradations for Storage ClassMemory Applications; Electron Devices Meeting (IEDM), 2014 IEEE International; Jun. 18, 2014; 3 pgs.

Kim, Kinam et al., "Reliability Investigations for Manufacturable High Density PRAM," IEEE 43rd Annual International Reliability Physics Symposium, San Jose, Apr. 17-21, 2005, pp. 157-162.

Lacita, A. L., "Electrothermal and Phase-change Dynamics in Chalcogenide-based Memories," IEEE IEDM Dec. 13-15, 2004, 4 pp.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming et al.; Temperature dependence on the contact size of GeSbTe films for phase change memories; published online: Jan. 23, 2008; J Comput Electron (2008) 7: pp. 138-141.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

* cited by examiner

1

METHOD AND APPARATUS FOR HEALING PHASE CHANGE MEMORY DEVICES

REFERENCE TO RELATED APPLICATIONS

The present application is a continuation of U.S. patent application Ser. No. 14/566,453 filed on 10 Dec. 2014 (now U.S. Pat. No. 9,336,878), which application claims the benefit of U.S. Provisional Application No. 62/013,558 filed on 18 Jun. 2014 and both applications are incorporated by reference as if fully set forth herein.

BACKGROUND OF THE INVENTION

Field of the Invention

The present invention relates to thermal-based memory technology, such as phase change material memory technology.

Description of Related Art

Phase change memory is a class of non-volatile memory integrated circuit technology that is thermally-based. A phase change memory cell may be comprised of top and bottom electrodes, and a layer of phase change material in between the electrodes. The phase change material has at least two solid phases, including for example a generally amorphous solid phase and a generally crystalline solid phase. The phase change material can change phase by application of electrical current through the layer of phase change material. The generally amorphous state is characterized by higher resistivity than the generally crystalline state. The differences in resistivity can readily be sensed to detect data stored by the phase change memory cell.

The change from the amorphous to the crystalline phase, referred to herein as the SET operation, may be performed by applying an electrical pulse through the phase change material. In the electrical pulse, an initial peak current is followed by decreasing current over the duration of the pulse so that the phase change material slowly cools into the crystalline state.

The change from the crystalline phase to the amorphous phase, referred to herein as the RESET operation, may be performed by applying a short high current pulse through the phase change material to melt or break down the crystalline phase structure in the phase change material. Afterwards the phase change material cools quickly, quenching the phase change process and allowing at least a portion of the phase change material to stabilize in the amorphous state.

Phase change memory has the advantageous properties of scalability, DRAM-like operation and non-volatility, which make it a good candidate for storage class memory. However, SET/RESET cycling of a memory cell causes stress which over time causes degradation of the phase change material in the memory cell. This degradation of the phase change material in a memory cell is associated with endurance issues including cells no longer being able to store data. Proposed solutions to improve the endurance of phase change memory have been based on various material and structural innovations, such as material doping, confined cell structure, and operation optimization. However, these proposed solutions do not address degradation of the phase change material which will limit the endurance of the phase change memory.

It is therefore desirable to provide devices supporting a method of increasing the endurance of phase change memory cells by reducing degradation of phase change material in the memory cell.

SUMMARY OF THE INVENTION

One aspect of the technology is a method of operating a first memory cell including a phase change material. The first memory cell is programmable to store one data value of a plurality of data values. The plurality of data values are represented by a plurality of non-overlapping ranges of resistance of the first memory cell. The method comprising:

applying at least one testing pulse to the first memory cell to establish a cell resistance of the first memory cell in an intermediate range of resistance, the intermediate range of resistance in between first and second adjacent ranges in the plurality of non-overlapping ranges of resistance representing the plurality of data values; and after applying the at least one testing pulse to the first memory cell, determining whether to apply at least one healing pulse to repair the first memory cell, depending on relative values of (i) the cell resistance in the intermediate range of resistance and (ii) a reference resistance in the intermediate range of resistance.

One embodiment of the technology further comprises:
responsive to the cell resistance falling below the reference resistance, applying the at least one healing pulse to the first memory cell.

In one embodiment of the technology, the plurality of data values has a total quantity of data values equal to a power of two.

In one embodiment of the technology, the first memory cell is programmable to store a first data value represented by the first adjacent range, by applying at least one first current pulse to the first memory cell for a first duration.

In one embodiment of the technology, the first memory cell is programmable to store a second data value represented by the second adjacent range, by applying at least one second current pulse to the first memory cell for a second duration, the second duration shorter than the first duration, wherein the method comprises:

applying the at least one healing pulse to repair the first memory cell for a third duration longer than the first duration and the second duration.

In one embodiment of the technology, the first memory cell is programmable to store a first data value represented by the first adjacent range, by applying at least one first current pulse to the first memory cell having a first current maximum, the first memory cell is programmable to store a second data value represented by the second adjacent range, by applying at least one second current pulse to the first memory cell for a second duration having a second current maximum, wherein the method further comprises:

applying, to repair the first memory cell, the at least one healing pulse having a third current maximum less than the first current maximum and the second current maximum.

One embodiment of the technology further comprises:
applying the at least one healing pulse to the first memory cell.

One embodiment of the technology further comprises:
applying the at least one healing pulse to a set of one of more second memory cells located proximate to the first memory cell.

One embodiment of the technology further comprises:
applying the at least one healing pulse via at least one heating device located proximate to the first memory cell.

In one embodiment of the technology, the at least one heating device is at least a second memory cell with phase change material.

One embodiment of the technology further comprises:
applying the at least one testing pulse in response to the first memory cell reaching a predetermined numbers of access cycles.

Another aspect of the technology is an integrated circuit comprising an array of memory cells. The integrated circuit includes a first memory cell including a phase change material and control circuitry. The control circuitry performs:
programming memory cells in the array to store one data value of a plurality of data values, the plurality of data values represented by a plurality of non-overlapping ranges of resistance;
applying at least one testing pulse to the first memory cell to establish a cell resistance of the first memory cell in an intermediate range of resistance, the intermediate range of resistance in between first and second adjacent ranges in the plurality of non-overlapping ranges of resistance representing the plurality of data values; and
after applying the at least one testing pulse to the first memory cell, determining whether to apply at least one healing pulse to repair the first memory cell, depending on relative values of (i) the cell resistance in the intermediate range of resistance and (ii) a reference resistance in the intermediate range of resistance.

In one embodiment of the technology, the control circuitry performs:
responsive to the cell resistance falling below the reference resistance, applying the at least one healing pulse to the first memory cell.

In one embodiment of the technology, the plurality of data values has a total quantity of data values equal to a power of two.

In one embodiment of the technology, the first memory cell is programmable to store a first data value represented by the first adjacent range, by applying at least one first current pulse to the first memory cell for a first duration,
the first memory cell is programmable to store a second data value represented by the second adjacent range, by applying at least one second current pulse to the first memory cell for a second duration, the second duration shorter than the first duration,
wherein the control circuitry performs:
applying the at least one healing pulse to repair the first memory cell for a third duration longer than the first duration and the second duration.

In one embodiment of the technology, the first memory cell is programmable to store a first data value represented by the first adjacent range, by applying at least one first current pulse to the first memory cell having a first current maximum,
the first memory cell is programmable to store a second data value represented by the second adjacent range, by applying at least one second current pulse to the first memory cell for a second duration having a second current maximum,
wherein the control circuitry performs:
applying, to repair the first memory cell, the at least one healing pulse having a third current maximum less than the first current maximum and the second current maximum.

In one embodiment of the technology, the control circuitry performs:
applying the at least one healing pulse to the first memory cell.

In one embodiment of the technology, the control circuitry performs:
applying the at least one healing pulse to a set of one of more second memory cells located proximate to the first memory cell.

In one embodiment of the technology, the control circuitry performs:
applying the at least one healing pulse via at least one heating device located proximate to the first memory cell.

In one embodiment of the technology, the at least one heating device is at least a second memory cell with phase change material.

In one embodiment of the technology, the control circuitry performs:
applying the at least one testing pulse in response to the first memory cell reaching a predetermined numbers of access cycles.

Yet another aspect of the technology is an apparatus with a first memory cell including a phase change material, the first memory cell programmable to store one data value of a plurality of data values, the plurality of data values represented by a plurality of non-overlapping ranges of resistance of the first memory cell, comprising:
means for applying at least one testing pulse to the first memory cell to establish a cell resistance of the first memory cell in an intermediate range of resistance, the intermediate range of resistance in between first and second adjacent ranges in the plurality of non-overlapping ranges of resistance representing the plurality of data values; and
means for, after applying the at least one testing pulse to the first memory cell, determining whether to apply at least one healing pulse to repair the first memory cell, depending on relative values of (i) the cell resistance in the intermediate range of resistance and (ii) a reference resistance in the intermediate range of resistance.

Other aspects and advantages of the present invention can be seen on review of the drawings, the detailed description and the claims, which follow.

DETAILED DESCRIPTION

Figure 1A:
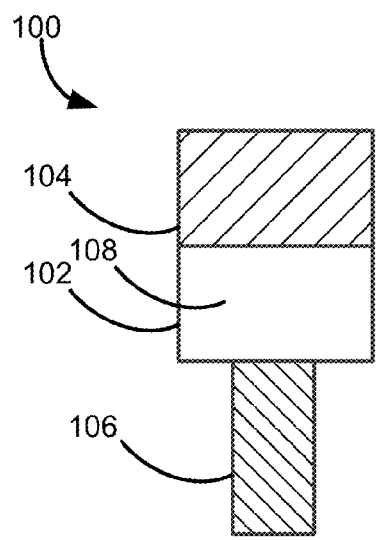
FIG. 1A is a schematic of a portion of a memory cell in the SET state.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

Figure 1B:
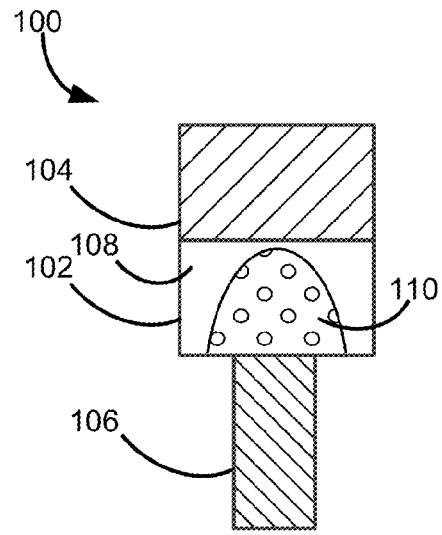
FIG. 1B is a schematic of a portion of a memory cell in the RESET state.

FIGS. 1A and 1B illustrate schematics of a portion of a memory cell in accordance with an embodiment. The memory cell 100 includes a memory element 102 located between a top electrode 104 and a bottom electrode 106. The memory element 102 includes a layer of phase change material. The phase change material may change between amorphous and crystalline phases.

Embodiments of the memory cell include phase change based memory materials, including chalcogenide based materials and other materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

The portion of the memory cell 100 shown in FIG. 1A is in the SET state where the phase change material of the memory element 102 is in the crystalline phase 108. The portion of the memory cell 100 shown in FIG. 1B is in the RESET state where the phase change material of the memory element 102 includes a large portion stabilized in the amorphous phase 110 in the current path between the top electrode 104 and bottom electrode 106 and also includes portions in the crystalline phase 108. A current applied through the top and bottom electrodes 104 and 106 of the memory cell 100 can cause heating of the memory element 102 which allows a change between the SET and RESET states to occur. This changing between states may be done on the orders of thousands to millions or more times during the normal operation of a memory device and is referred to herein as cycling. This cycling causes stress in the memory cell which leads to degradation of the phase change material.

Figure 2:
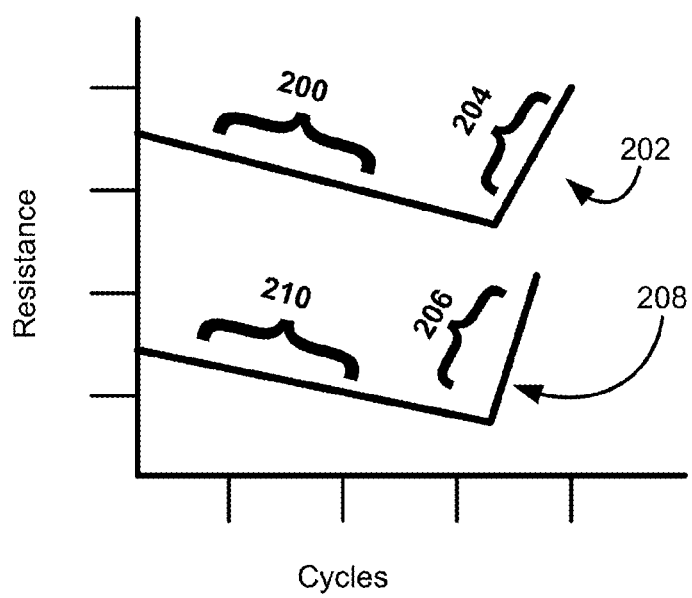
FIG. 2 is a chart illustrating the changes of SET and partial reset resistances as cycling increases.
Figure 3A:
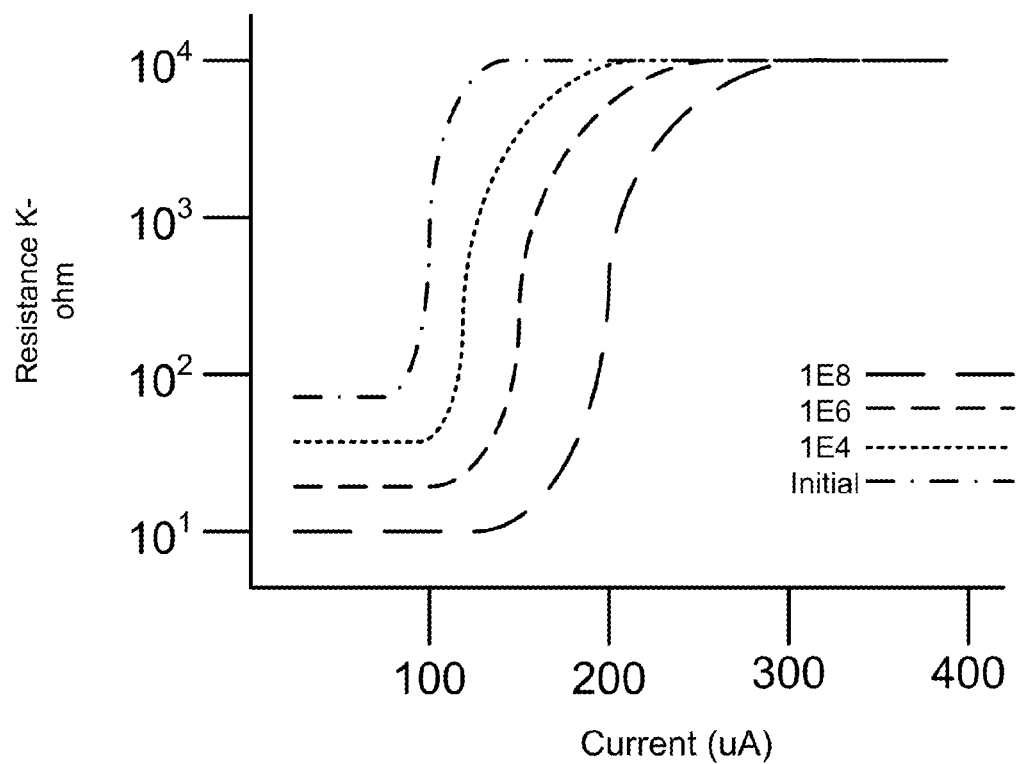
FIG. 3A is a chart illustrating applied current vs. resistance curves of a memory cell through various stages of cycling during the right shift.
Figure 3B:
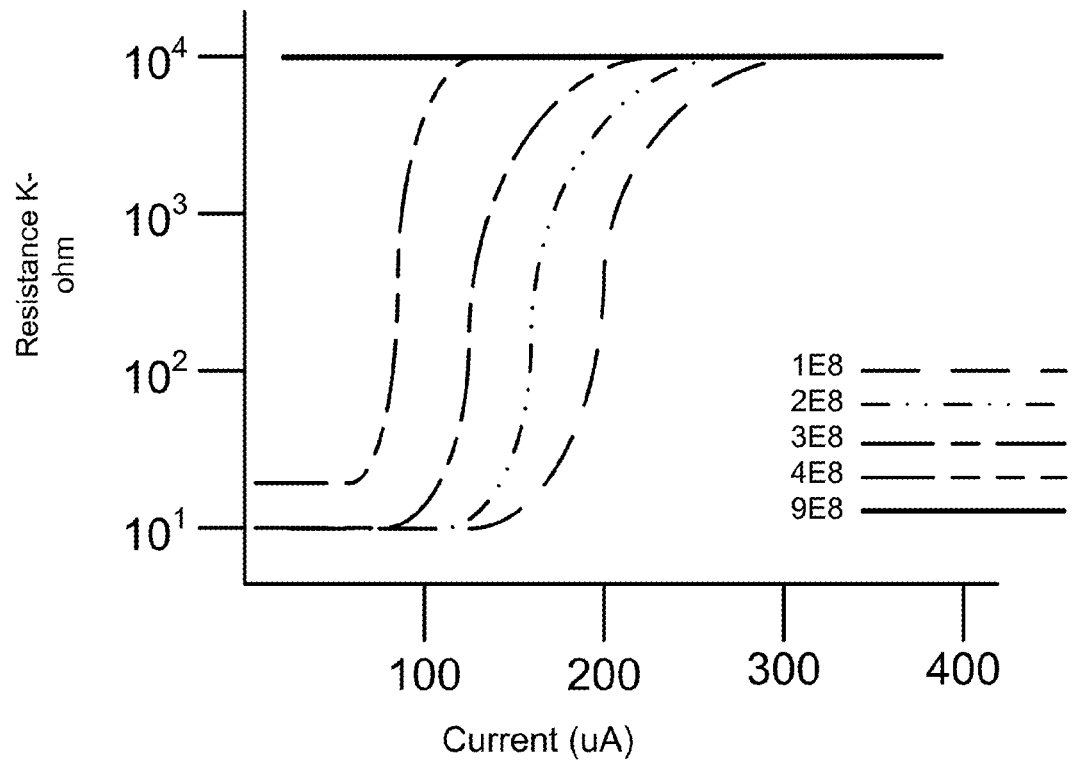
FIG. 3B is a chart illustrating applied current vs. resistance curves of a memory cell through various stages of cycling during the left shift.

The degradation of the phase change material in the memory element 102 appears in two stages. The first stage, referred to herein as the "right shift", is a shift of the resistance of the memory cell vs. applied current that occurs during low to moderate cycling. The second stage, referred to herein as the "left shift", is a shift of resistance of the memory cell vs. applied current that occurs during moderate to high cycling. The right shift can be identified by a change in the partial reset resistance. In the embodiment shown in FIG. 2 the right shift can be identified by a downhill decrease 200 of the partial reset resistance 202 as cycling increases. As shown in FIG. 2 the left shift can be identified by an uphill recovery 204 of the partial reset resistance 202 accompanied by increased 206 SET resistance 208 as cycling increases. Further, during the right shift, the downhill decrease 200 of the partial reset resistance 202 may also be accompanied by a downhill decrease 210 of the SET resistance 208. FIG. 3A illustrates detailed resistance vs. applied current curves of a memory cell undergoing the right shift stage and FIG. 3B illustrates detailed resistance vs. applied current curves of a memory cell undergoing the left shift stage. A resistance vs. applied current curve shows the increasing resistance of a memory cell as current is applied and the memory cell changes from a low resistance SET state to a high resistance RESET state. The middle portions of the curves are referred to herein as a partial reset states. In FIG. 3A the resistance vs. applied current curves include curves from an initial starting curve where the memory cell has been cycled zero times to a curve where the memory cell has undergone 1E8 cycles. In FIG. 3B, the resistance versus current curves include curves from 1E8 to 9E8 cycles, wherein the 1E8 cycles curve is the same as in FIG. 3A. As shown, in FIG. 3A as cycles increase the resistance of the partial reset state decreases for a given current, and therefore the curves shift right. Further, as shown in FIG. 3B as the cycles further increase the resistance of the partial reset state then increases, and therefore the curves shift left. These illustrative charts are based on experimental data with GST-225 as the phase change material in the memory element. Embodiments may include different memory cells with different material properties and physical configurations. These embodiments may transition from the right shift to the left shift at different stages in cycling.

The right shift shown in FIG. 3A and the left shift shown in FIG. 3B correspond to the decrease 200 and recovery 204 of the partial reset resistance 202 in FIG. 2. As shown in FIG. 3B, after the left shift occurs, the open failure condition occurs where the resistance remains at a constant high value independent of the applied current. In the embodiment shown the open failure occurs between 4E8 and 9E8 cycles, as evidenced by the 9E8 curve having a constant high resistance. During the right and left shifts, the degradation may be repaired. In embodiments, the degradation may be more easily and more completely repaired before the memory cell exhibits signs of the left shift. Once the open failure condition occurs repairing the phase change material is more difficult. It is therefore advantageous to identify degradation prior to unrepairable degradation.

Figures 4A, 4B, 4C:
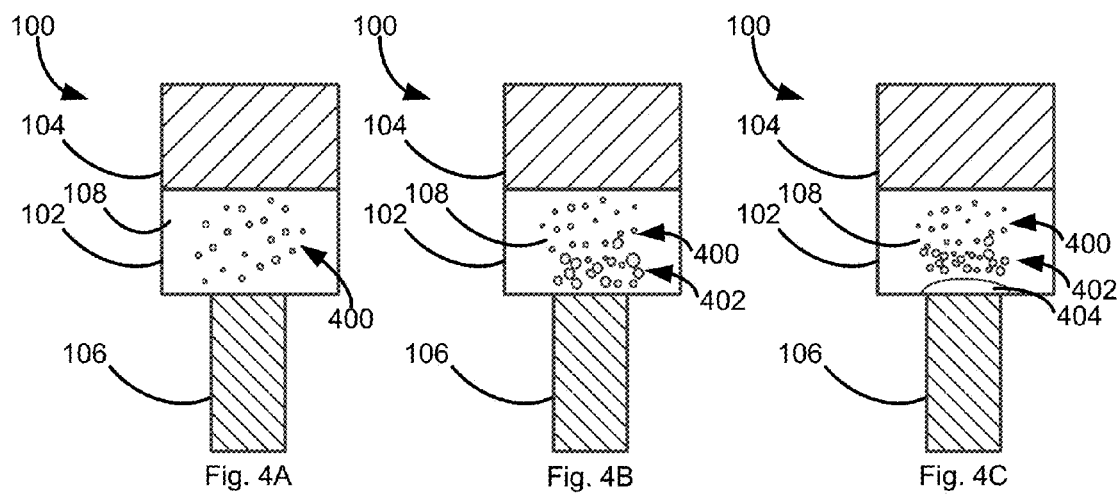
FIGS. 4A-C are schematics of a portion of a memory cell experiencing different stages of phase change material degradation illustrating void formation.

Causes of the degradation of the phase change material include compositional changes and void formation in the phase change material of the memory element. FIGS. 4A-C show schematics of a portion of a memory cell 100 for illustrative purpose to show void formation during the left shift, right shift and open failure conditions. The memory cell 100 begins with no degradation as is shown in FIG. 1A with no voids formed in the memory element 102. As stress caused by SET/RESET cycling occurs small voids 400 are generated within the memory element and are a contributing cause of the right shift, as shown in FIG. 4A. As cycling continues, more small voids 400 are generated, as well as agglomeration and accumulation of the existing voids, forming larger voids 402 toward the bottom electrode 106, both of which are a contributing cause of the left shift, as shown in FIG. 4B. If the cycling continues the degradation will continue until the open failure condition occurs as illustrated in FIG. 4C wherein the agglomeration and accumulation of the small voids 400 and larger voids 402 creates a very large void 404 completely covering the bottom electrode 106.

Figure 5A:
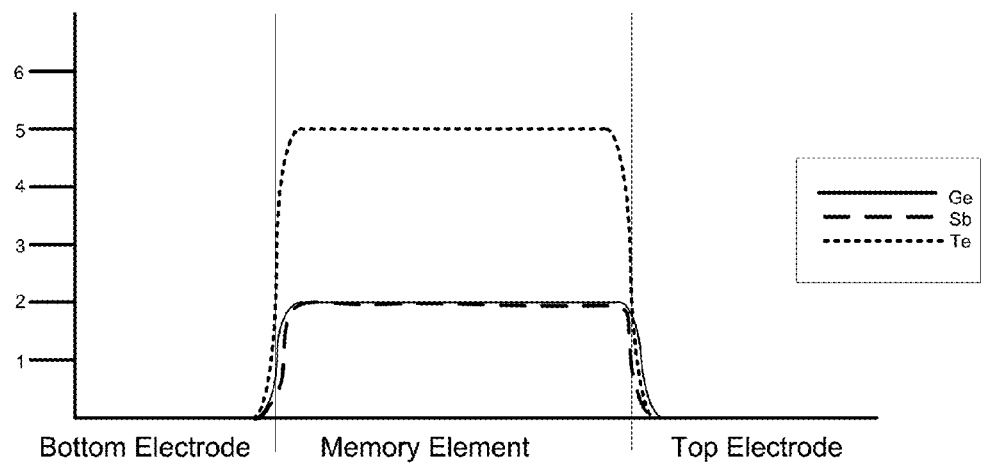
FIG. 5A is a chart illustrating an initial even distribution of the proportions of elemental components of a phase change memory cell prior to degradation.
Figure 5B:
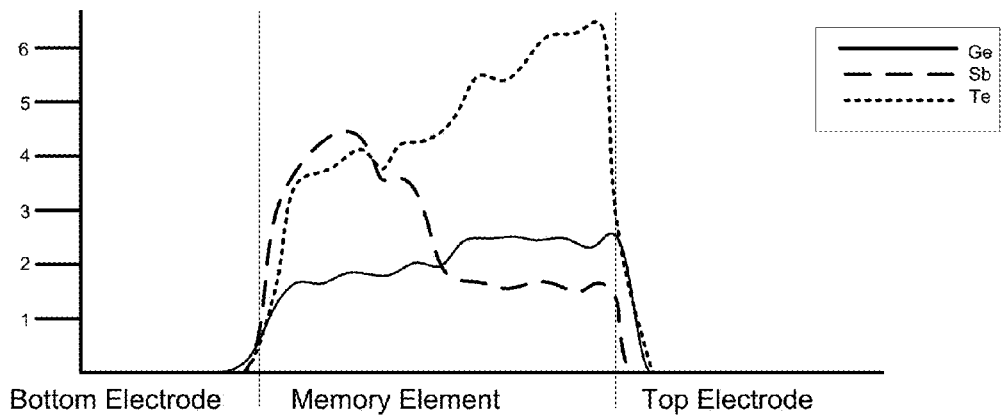
FIG. 5B is a chart illustrating an uneven distribution of the proportions of elemental components of a phase change memory cell experiencing degradation.

FIGS. 5A and 5B show charts providing an illustrative example of compositional change of the phase change material in the memory cells. The y-axis represents the relative quantity of an elemental component Ge, Sb, Te of the phase change material present at a location within the memory cell, and the x-axis represents the location within the memory cell. In this example, the phase change material of the memory element is GST-225, which comprises Ge:Sb:Te in approximate proportions of 2:2:5. The figures include two vertical lines representing the interface of the memory element and the bottom electrode, left line, and the top electrode, right line. FIG. 5A, shows initial pre-degradation even distribution of Ge:Sb:Te where the proportions of the three elements are uniform throughout the memory element at a ratio of about 2:2:5. FIG. 5B shows an example of the same GST-225 memory layer affected by degradation including compositional change. In the example of compositional change shown in FIG. 5B, the Te migrates toward the top electrode causing a Te rich region and the Sb toward the bottom electrode causing a Sb rich region. Further, other non-uniformness of the distribution of the proportions of the different elements is present throughout the memory element.

Applying thermal energy to degraded phase change material of a memory cell can reverse the degradation including reducing or eliminating the voids and restoring the elemental proportional distribution towards more uniform proportions. This application of thermal heat is herein heuristically refer to as healing. Applying a threshold amount of thermal energy to a memory cell with phase change material degradation causes the degradation to be repaired to a point where the memory cell displays a similar resistance vs. applied current curve as the memory cell did in the initial zero cycles state, as shown in FIG. 3A. Once repaired, future degradation occurs in a similar fashion as to a memory cell starting from the initial zero cycles state that has not been previously healed. Due to this ability to essentially completely repair the degradation, the healing of the phase change material can be repeated many times. The application of the thermal energy may be performed with a healing operation controlled by the control circuitry of the memory device.

Figure 6:
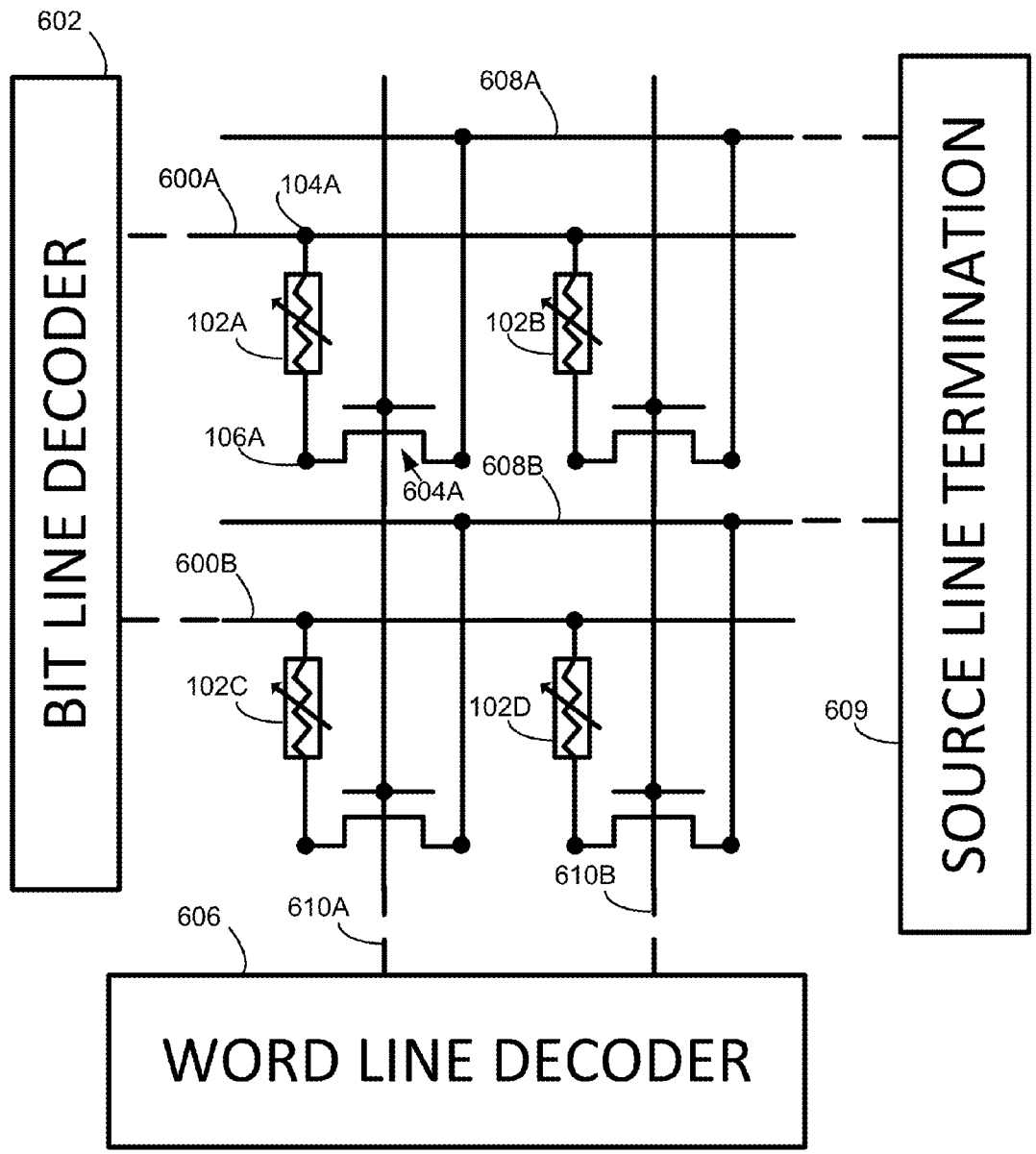
FIG. 6 is a schematic diagram of a memory array comprising phase change memory cells.

FIG. 6 is a schematic illustration of a memory array which can be implemented as described herein. Four representative memory cells including memory elements 102A, 102B, 102C, and 102D are illustrated, representing a small section of an array that can include millions of memory cells. As can be seen, the memory cell including memory element 102A includes a top electrode 104A and a bottom electrode 106A, with the memory element 102A comprising a phase change material in electrical communication with the top and bottom electrodes.

A plurality of first access lines 600A and 600B, in the example two bit lines, are in electrical communication with a bit line decoder 602. The top electrode 104A of the memory cell including memory element 102A is connected to the first access line 600A. The bottom electrode of memory cell including memory element 102A is coupled to a first terminal of access device 604A, in the embodiment shown an access transistor. A plurality of second access lines 608A and 608B, in the example two source lines, are coupled to a source line termination circuit, such as a ground terminal 609. Second access line 608A is further is connected to a second terminal of the access device 604A. The source line termination circuits may include bias circuits such as voltage sources and current sources, and decoding circuits for applying bias arrangements, other than ground, to the source lines in some embodiments. A plurality of third access lines 610A and 610B, in the example two word lines, are coupled to a word line decoder 606, having set, reset, read and heal modes. The other memory cells in the array, including memory celling including memory elements 102B, 102C, and 102D are connected in a similar fashion. The bit line decoder, source line termination and word line decoder form a portion of the control circuitry of the memory device.

In operation, bit line decoders and word line decoders operate in a read mode, set mode, reset mode and heal mode. To access a cell in the reset, set and read and heal modes, a current path through the selected memory cell (e.g. memory cell including memory element 102A) is established by applying a current to the first access line 600A, and voltage on the third access line 610A sufficient to turn on the access transistor 604A, so that the current flows through second access line 608A.

Figure 7:
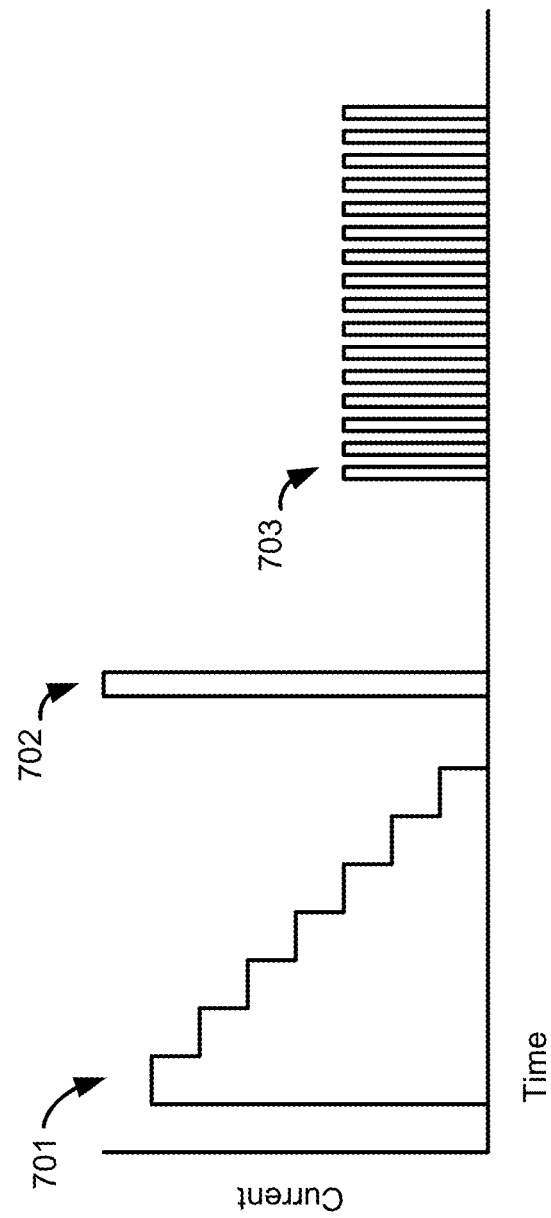
FIG. 7 is a chart showing embodiments of pulse shapes for SET, RESET and HEAL operations.

FIG. 7 illustrates the waveforms of pulses of the SET, RESET and HEAL operations that are used when accessing a memory cell for said operation. The HEAL operation waveform 703 is much lower current than the SET and RESET operation waveform 701 and 702, respectively. For example the HEAL operation waveform 703 may have a peak current that is less than one-half, and in some embodiments less than one fourth, of the peak current of the RESET operation waveform 702. The change from the amorphous to the crystalline state, referred to herein as the SET operation, may be performed by applying an initial peak current and decreasing this current over time so that the phase change material slowly cools into the crystalline state. In the example, the SET operation waveform 701 has an initial peak and then decreases in a step-like fashion until current is no longer being applied. The change from the crystalline state to the amorphous state, referred to herein as the RESET operation, may be performed by applying a short high current pulses to melt or break down the crystalline structure, after which the phase change material cools quickly, quenching the phase change process and allowing at least a portion of the phase change material to stabilize in the amorphous state. In the example shown, the RESET operation waveform 702 is a single rectangular wave. The example HEAL operation waveform 703 includes a plurality of low current pulses, including 10 rectangular pulses. In embodiments, a memory cell accessed in a heal mode is heated due to the one or more low current pulses of the heal operation passing through the memory element. These embodiments may be referred to as self-healing because the heat for the healing of the memory cell is generated by the memory cell being healed. In embodiments, the heal operation waveform may include one or more pulses, the pulses may have the same or different currents, shapes and durations.

The relative amount of repair of a memory that occurs during a heal operation is proportional to the amount of thermal energy received by the phase change material in the memory cell. In self-healing embodiments, the amount of thermal energy is determined by the applied current and the duration of the current. More healing occurs with higher currents and/or longer total pulse duration. However, if the current in the heal operation waveform is too high damage caused by stress will outweigh the benefit of healing. In embodiments, it has been found that the upper boundary for self-healing current is 200 uA. The amplitude of the pulse is determined to provide the necessary healing energy and yet not cause unwanted damage to the phase change material.

In embodiments the thermal energy for healing a target memory cell may solely or partially come from one or more sources other than the target memory cell being healed. These sources may include a combination of one or more of neighboring memory cells and heating elements. The neighboring memory cells may be heated using a similar waveform as used to heat a memory cell in self-healing embodiments described above. Heating elements may be located proximate to an array of memory cells to be able to deliver heat to one or more memory cells located proximate to the heating element. In embodiments heat generated in a first memory cell may fully or partially repair the degradation of the phase change material in the first memory cell as well as be received by a second memory cell for full or partial repair of degradation of the phase change material in the second memory cell.

Figure 8:
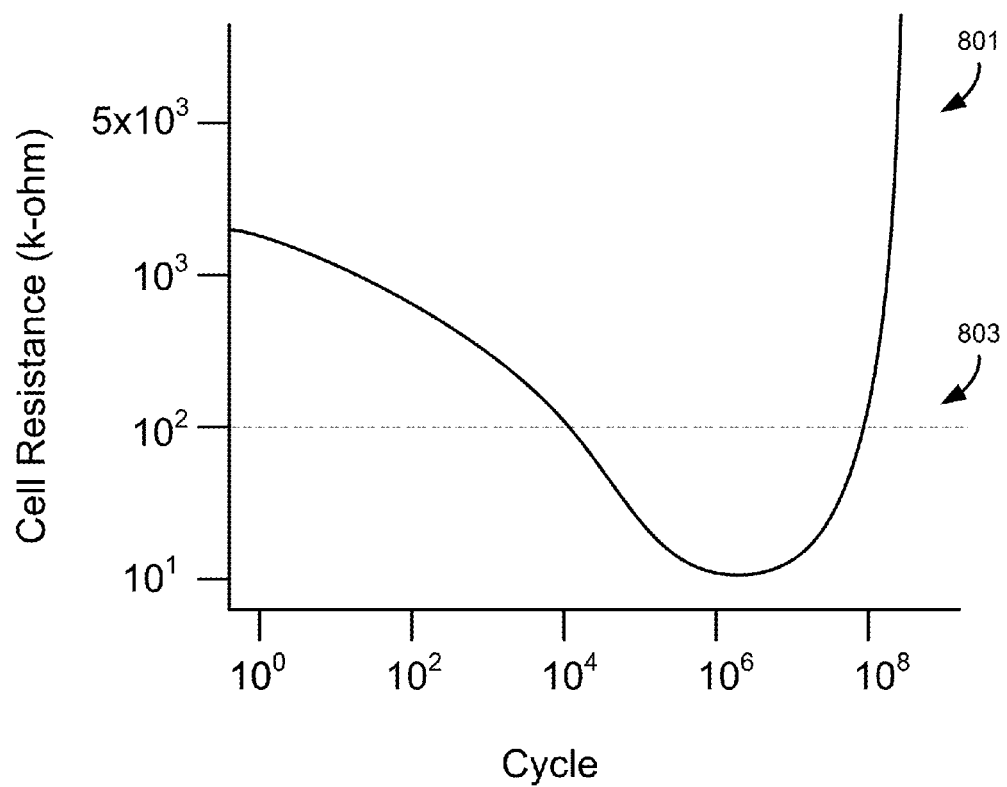
FIG. 8 is a chart showing detected partial reset resistances in a memory as cycling of the memory cell increases

To extend the endurance of a memory device it is beneficial to repair degradation of phase change material in the earlier stages of degradation as these stages are the most easy to repair. The degradation in later stages of degradation may not be able to be completely repaired or may not be repairable at all, such as in the open failure condition. In embodiments, in order to detect early stages of degradation a partial reset resistance of a memory cell is detected. If the partial reset resistance of a memory cell falls below a predetermined reference value an alarm signal will be generated. FIG. 8 shows a chart illustrating an example of detected partial reset resistances 801 in a memory as cycling of the memory cell increases. To detect a partial reset resistance, a partial reset pulse, also heuristically referred to herein as a testing pulse, is issued to the cell. In the example the partial reset pulse is a single pulse 150 uA in amplitude and 50 ns in duration. After a partial reset pulse is issued to the cell the cell will have a resistance in a resistance range in between the resistance ranges of the SET and RESET states. In multi-level cells the partial reset resistance used to test for degradation may be within a range of resistances that is between the ranges of resistance of two adjacent states of the cell that correspond to stored date values. Adjacent states heuristically refers to two states of a memory cell each associated with a stored data value and each corresponding to a range of resistance, wherein there is not another state of the memory cell associated with resistances between the resistance ranges of the two states.

As can be seen in the example in FIG. 8, the partial reset resistances 801 of a memory cell have a u-shape as cycles, and therefore degradation of the cell, increase. The shape of the curve includes a left decreasing side corresponding to the right shift, and a steep increasing right side corresponding to the left shift. To determine if the cell has reached a point in the early stages of degradation the cell resistance is compared to a reference resistance 803.

A reference resistance 803 is a partial reset resistance that is selected to correspond to the stage in cycling, and thus degradation, that healing is desired. When the detected partial reset resistance 801 falls below the reference resistance 803 an alarm signal is generated so that a heal operation may be performed to heal the memory cell. In the embodiment shown, the reference resistance is set at 100 k-ohms and the partial reset resistance of the memory cell will drop below this reference resistance at just above $10^4$ cycles. The reference resistance may be set higher or lower depending on how aggressive of healing scheme is desired.

Once an alarm signal is generated a healing command is issued to initiate a healing operation, as described above, which may be done to repair the memory cell with the detected degradation of phase change material.

In embodiments, an alternative to monitoring the resistance to determine the stage of degradation is to monitor the current needed to achieve a predetermined resistance. In these embodiments, when the current exceeds a reference current an alarm signal is generated. For example, a predetermined resistance may be set at 100 kΩ, Initially 80 uA of applied current is needed to achieve this resistance. After stressing the applied current needed may increase to 120 uA. In this case the reference current may be set at 120 uA so that when this condition is detected the alarm signal is generated.

In embodiments, instead of monitoring a memory cell to determine when a healing operation is needed, a healing operation may be performed periodically at predetermined numbers of reset and/or set cycles.

Alternatively, or in combination, the healing operation may be performed by turning on a current path through one or more memory cells proximate to the selected memory cell.

In another embodiment, the healing operation may be performed in addition on memory cells proximate to the memory cell which triggers the alarm signal.

Figure 9:
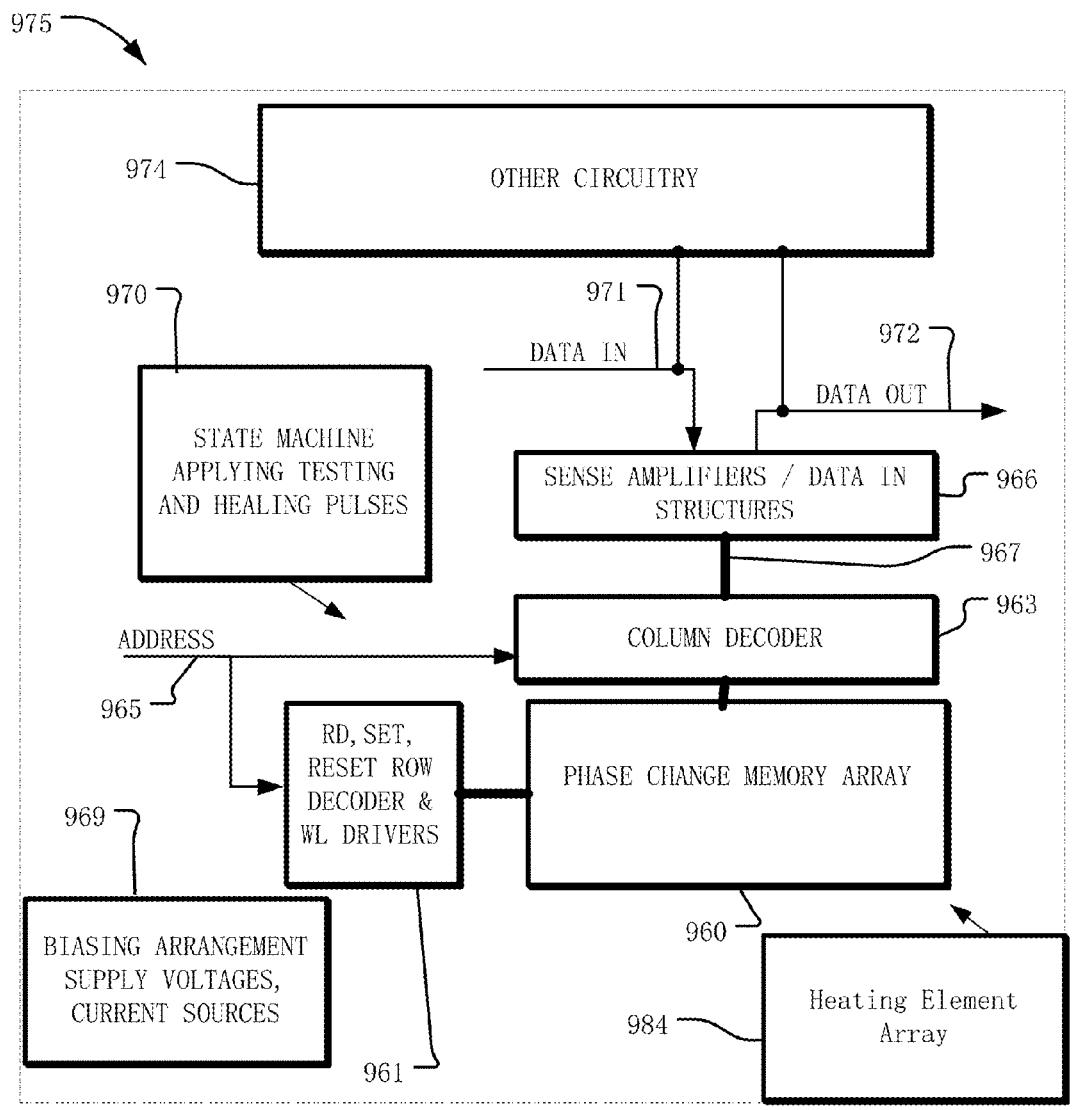
FIG. 9 is a block diagram of an integrated circuit device including a phase change memory array.

FIG. 9 is a simplified block diagram of an integrated circuit according to an embodiment of the present invention. The integrated circuit includes a memory array 960 implemented using phase change memory cells. Biasing circuitry 969 includes voltage supplies and current sources to generate the biasing arrangement for performing regular memory operations as well as the testing and healing operations. State machine 970 controls biasing circuitry 969 to perform regular memory operations and the testing and healing operations. A word line decoder having read, set and reset and heal modes is coupled to a plurality of word lines. A bit line decoder is coupled to a plurality of bit lines arranged along columns in the memory array for reading, setting, resetting and healing memory cells in the memory array . Addresses are supplied on bus 965 to word line column decoder 963 and bit line decoder 961. Sense amplifiers and data-in structures in block 966, including current sources for the read, set, reset and heal modes, are coupled to the column decoder 963 via data bus 967. Data is supplied via the data-in line 971 from input/output ports on the integrated circuit or from other data sources internal or external to the integrated circuit, to the data-in structures in block 966. In the illustrated embodiment, other circuitry 974 is included on the integrated circuit 975, such as a general purpose processor or special purpose application circuitry, or a combination of modules providing system-on-a-chip functionality supported by the phase change memory cell array. Data is supplied via the data-out line 972 from the sense amplifiers in block 966 to input/output ports on the integrated circuit 975, or to other data destinations internal or external to the integrated circuit 975. The integrated circuit may further include a heating element array 984 that may receive a healing command and undertake a healing operation to apply heat to the phase change memory array 960.

Figure 10A:
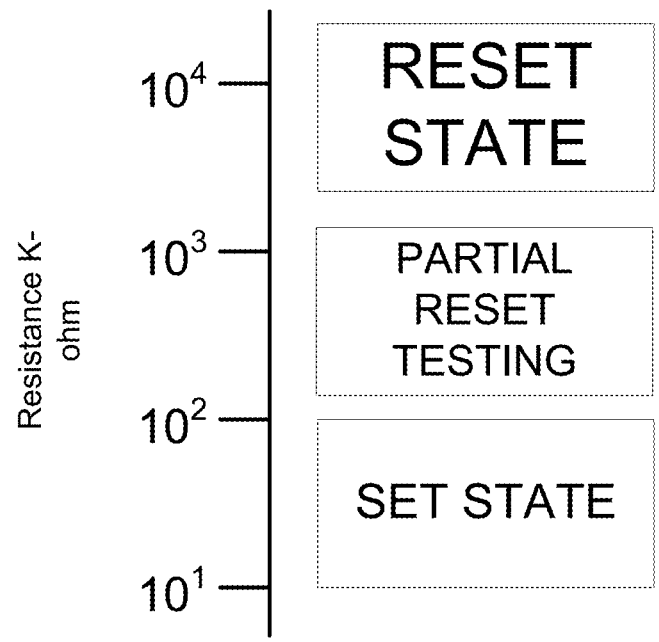
FIGS. 10A and 10B are example diagrams of resistance ranges that represent different values stored by a nonvolatile memory device, and the additional intermediate range.
Figure 10B:
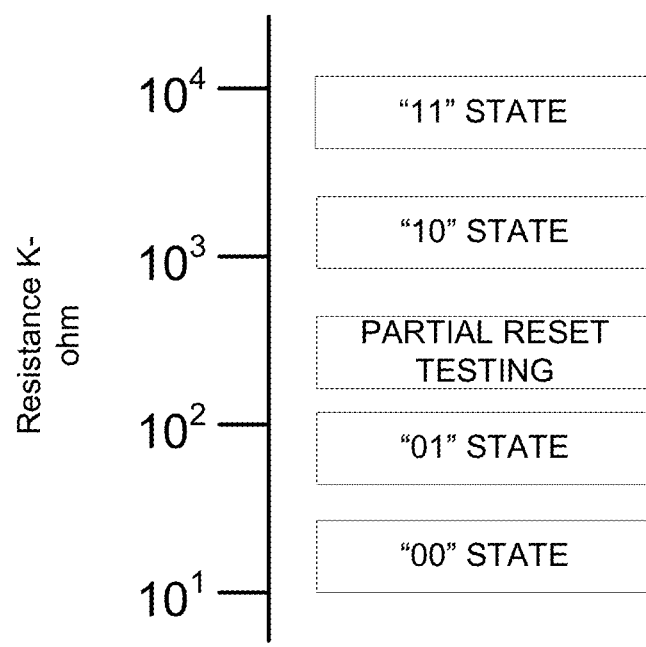

FIGS. 10A and 10B are example diagrams of resistance ranges that represent different values stored by a nonvolatile memory device, and the additional intermediate range. FIGS. 10A and 10B respectively show the resistance ranges that represent different values in a 2 level device (i.e. a "single level cell") and a 4 level device (i.e, a "multi level cell"). Other embodiments include an 8 level device (i.e., a "triple level cell") and devices with more levels. FIG. 10A has a reset state and a set state with respective non-overlapping resistance ranges. In between the reset state and the set state, an intermediate resistance range is used for partial reset testing. FIG. 10B has a 11 state, 10 state, 01 state, and a 00 state, with respective non-overlapping resistance ranges. In between the adjacent 10 state and the adjacent 01 state, an intermediate resistance range is used for partial reset testing. Alternatively, partial reset testing can use the intermediate resistance range in between the adjacent 11 state and the adjacent 10 state, or in between the adjacent 01 state and the adjacent 00 state.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating an array of memory cells, the memory cells including a phase change material, the memory cells programmable to store a plurality of data values, the plurality of data values represented by a plurality of non-overlapping ranges of resistance of the memory cells, the method comprising:

executing set and reset operations to memory cells in the array, the array including a first memory cell, to program resistances in the memory cells within the plurality of non-overlapping ranges of resistance representing the plurality of data values; and applying healing thermal energy to selected memory cells in the array after a predetermined number of set and/or reset cycles, wherein said applying healing thermal energy includes applying one or more current pulses having lower current amplitude than set and reset current pulses.

2. The method of claim 1, wherein:
said applying healing thermal energy includes applying current pulses to memory cells proximate to at least one of the selected memory cells.

3. The method of claim 1, wherein:
the set operation for a particular memory cell in the array includes applying at least one first current pulse to the particular memory cell for a first duration;
the reset operation for the particular memory cell in the array includes applying at least one second current pulse to the particular memory cell for a second duration, the second duration shorter than the first duration; and
said applying thermal energy includes applying a set of pulses, the set of pulses including one or more pulses, to the particular memory cell, the set of pulses having a third duration longer than the second duration.

4. The method of claim 1, wherein:
the set operation for a particular memory cell in the array includes applying at least one first current pulse to the particular memory cell having a first current maximum;
the reset operation for the particular memory cell in the array includes applying at least one second current pulse to the particular memory cell having a second current maximum, the second current maximum being greater than the first current maximum, and
said applying thermal energy includes applying the at least one healing pulse to the particular memory cell with a third current maximum, the third current maximum being less than the second current maximum.

5. The method of claim 1, wherein said applying thermal energy includes:
applying a current pulse to the first memory cell; and
applying a current pulse or pulses to a set of one or more second memory cells located proximate to the first memory cell.

6. The method of claim 1, wherein said applying thermal energy includes:
applying a current pulse to the selected memory cell; and
applying a current pulse or pulses to a set of one or more second memory cells located proximate to the selected memory cell.

7. The method of claim 1, wherein said applying thermal energy includes:
applying at least one healing pulse via at least one heating device located proximate to the selected memory cell.

8. The method of claim 1, wherein:
said applying healing thermal energy to selected memory cells in the array is executed after a predetermined number of set and/or reset cycles in the selected memory cells.

9. The method of claim 8, including, in addition to applying healing thermal energy to the selected memory cells, applying healing thermal energy to memory cells proximate to the selected memory cells.

10. An integrated circuit, comprising:
an array of memory cells, including:
a first memory cell including a phase change material;
control circuitry performing:
executing set and reset operations to the memory cells in the array, the array including the first memory cell, to program resistances in the memory cells within the plurality of non-overlapping ranges of resistance representing the plurality of data values; and
applying healing thermal energy to selected memory cells in the array after a predetermined number of set and/or reset cycles, wherein said applying healing thermal energy includes applying one or more current pulses having lower current amplitude than set and reset current pulses.

11. The integrated circuit of claim 10, wherein:
said applying healing thermal energy includes applying current pulses to memory cells proximate to at least one of the selected memory cells.

12. The integrated circuit of claim 10, wherein:
the set operation for a particular memory cell in the array includes applying at least one first current pulse to the particular memory cell for a first duration;
the reset operation for the particular memory cell in the array includes applying at least one second current pulse to the particular memory cell for a second duration, the second duration shorter than the first duration; and said applying thermal energy includes applying a set of pulses, the set of pulses including one or more pulses, to the particular memory cell, the set of pulses having a third duration longer than the second duration.

13. The integrated circuit of claim 10, wherein:
the set operation for a particular memory cell in the array includes applying at least one first current pulse to the particular memory cell having a first current maximum;
the reset operation for the particular memory cell in the array includes applying at least one second current pulse to the particular memory cell having a second current maximum, the second current maximum being greater than the first current maximum; and
said applying thermal energy includes applying the at least one healing pulse to the particular memory cell with a third current maximum, the third current maximum being less than the second current maximum.

14. The integrated circuit of claim 10, wherein said applying thermal energy includes:
applying a current pulse to the first memory cell; and
applying a current pulse or pulses to a set of one or more second memory cells located proximate to the first memory cell.

15. The integrated circuit of claim 10, wherein said applying thermal energy includes:
applying a current pulse to the selected memory cell; and
applying a current pulse or pulses to a set of one or more second memory cells located proximate to the selected memory cell.

16. The integrated circuit of claim 10, wherein said applying thermal energy includes applying at least one healing pulse via at least one heating device located proximate to the selected memory cell.

17. The integrated circuit of claim 10, wherein said applying healing thermal energy to selected memory cells in the array is executed after a predetermined number of set and/or reset cycles in the selected memory cells.

18. The integrated circuit of claim 17, including, in addition to applying healing thermal energy to the selected memory cells, applying healing thermal energy to memory cells proximate to the selected memory cells.

19. An integrated circuit, comprising:
an array of memory cells, including:
a first memory cell including a phase change material; and
control circuitry performing:
executing set and reset cycles to memory cells in an array, the array including the first memory cell, to program resistances in the memory cells within the plurality of non-overlapping ranges of resistance representing the plurality of data values; and
periodically applying healing thermal energy to selected memory cells in the array without using testing of the selected memory cells to determine when to apply the healing thermal energy, wherein said applying healing thermal energy includes applying one or more current pulses having lower current amplitude than set and reset current pulses.

\* \* \* \* \*